(12) United States Patent
Swanson

(10) Patent No.: US 6,751,641 B1
(45) Date of Patent: Jun. 15, 2004

(54) TIME DOMAIN DATA CONVERTER WITH OUTPUT FREQUENCY DOMAIN CONVERSION

(76) Inventor: Eric Swanson, 850 Jerry's La., Buda, TX (US) 78610

( * ) Notice: Subject to any disclaimer, the term of this patent is extended or adjusted under 35 U.S.C. 154(b) by 0 days.

(21) Appl. No.: 09/376,761

(22) Filed: Aug. 17, 1999

(51) Int. Cl.[7] ............................................. G06F 17/14
(52) U.S. Cl. .................. 708/403; 708/404; 708/405
(58) Field of Search ........................ 708/403, 404, 708/405

(56) References Cited

U.S. PATENT DOCUMENTS

| | | | |
|---|---|---|---|
| 3,721,812 A | * 3/1973 | Schmidt | 708/404 |
| 3,783,258 A | * 1/1974 | Chwastyk | 708/404 |
| 3,876,946 A | * 4/1975 | La Clair et al. | 708/404 |
| 3,899,667 A | * 8/1975 | Simone | 708/404 |
| 4,054,785 A | * 10/1977 | Lehmann | 708/405 |
| 4,080,661 A | * 3/1978 | Niwa | 708/405 |
| 4,542,304 A | 9/1985 | Swanson | 307/353 |
| 4,570,080 A | 2/1986 | Swanson | 307/353 |
| 4,823,297 A | * 4/1989 | Evans | 708/403 |
| 4,908,784 A | 3/1990 | Box et al. | 364/569 |
| 5,168,460 A | * 12/1992 | Tower | 708/407 |
| 5,548,748 A | 8/1996 | Fuse | 395/550 |
| 5,706,004 A | 1/1998 | Yeung | 341/122 |
| 6,157,938 A | * 12/2000 | Wu et al. | 708/404 |

OTHER PUBLICATIONS

Harris, Fredric J., *On the Use of Windows for Harmonic Analysis with the Discrete Fourier Transform*, Proceedings of the IEEE, vol. 66, No. 1, Jan. 1978. pp. 51–83.

* cited by examiner

*Primary Examiner*—David H. Malzahn
(74) *Attorney, Agent, or Firm*—Howison & Arnott, L.L.P.

(57) ABSTRACT

A time domain data converter with output frequency domain conversion. A data conversion circuit is operable to receive a signal in the time domain and provide an output in the frequency domain. It includes a data converter for converting data from an analog format to a digital format in the time domain. It also includes a processor for processing the data in the digital format output from the data converter through a time domain/frequency domain transform to provide data in the digital format in the frequency domain.

37 Claims, 6 Drawing Sheets

TIME DOMAIN DATA CONVERTER WITH OUTPUT FREQUENCY DOMAIN CONVERSION

TECHNICAL FIELD OF THE INVENTION

The present invention pertains in general to data converters and, more particularly, to a time domain data converter with the output thereof processed through a frequency domain transform to provide an output in the frequency domain.

BACKGROUND OF THE INVENTION

Conventional data converters provide either conversion from the analog domain to the digital domain in a typical analog-to-digital converter, or from the digital domain to an analog domain as a digital-to-analog converter. Typical analog-to-digital (A/D) converters of the delta sigma type provide some type of analog modulator for providing the initial data conversion, which is then followed by some type of filtering step. Conventionally, the filtering is performed in part in the digital domain. This requires some type of digital processing of the digital output of the modulator in the form of a digital filter such as a Finite Impulse Response (FIR) filter. However, the digital values output therefrom are values that exist in the time domain.

In some applications, it is desirable to determine information in the frequency domain after the conversion operation. Such applications as spectrum analyzers, for example, require such information. Therefore, the output of the data converter in the digital domain is then processed through some type of transform for converting time domain information to frequency domain information, this all completed in the digital domain.

The types of transform engines that are utilized to convert time domain information to digital domain information typically utilize some type of Fourier Transform, the most common being a Discrete Fourier Transform (DFT). The DFT is a one-to-one mapping of any finite sequence $\{y(r)\}$, $r=0,1,2 \ldots ,N-1$ of N complex samples onto another sequence. This is defined by the following relationship:

$$Y(k) = \sum_{r=0}^{N-1} y(r) w_N^{rk}$$

where:

$$w_N \equiv e^{-j2\pi/N} = \cos\frac{2\pi}{N} - j\sin\frac{2\pi}{N}$$

In general, a DFT algorithm requires a plurality of multiplication/accumulation operations. To reduce the number of these multiplication/accumulations, a Fast Fourier Transform (FFT) can be implemented to provide a rapid means for computing a DFT with $N\log_2 N$ multiplies, which otherwise would have taken $N^2$ complex multiplications. Even with the reduction of the number of multiplications, there are still a large number of multiplication/accumulation operations that are required in order to calculate the time domain/frequency domain conversion. Conventionally, a Digital Signal Processor (DSP) is required which is typically a separate integrated circuit. As such, whenever providing for both a data conversion operation with an A/D converter, and a time domain/frequency domain conversion with a DSP, there are typically required two integrated circuits.

In general, there does not exist a commercial monolithic solution providing both the benefits of a data converter with that of a frequency domain converter such that an analog input can be received, converted to the digital domain and this digital value processed to provide a frequency domain output. In general, typical solutions utilize a data converter that provides a digital value in the time domain which is then input to a processor. This processor can be in the form of a microcontroller or a DSP. A data converter, due to its inherent construction, basically provides the ability to convert an analog input signal to a digital time domain output signal with a defined bit-resolution. This, of course, provides an output in the time domain. When processing this time domain signal to provide a frequency domain output, the processor is programmed to process some type of Discrete Fourier Transform or Fast Fourier Transform. Any type of algorithm that provides such a transform can be utilized. However, in order for a designer to utilize such a transform, this requires programming of the processor or microcontroller. Therefore, if an existing design must be upgraded to provide such a function or be required to process in the frequency domain, then a more complex DSP or microcontroller must be utilized. This is due to the fact that any processing in the frequency domain requires a more complex processing capability. The result is that an upgrade to a frequency domain solution from a time domain solution will probably require the designer to change his design to incorporate a much more complex processing section, in addition to also requiring a significant amount of programming of that processing section, this programming being the most expensive aspect of such an upgrade. It is desirable to utilize the pre-upgrade processing section, which is typically a relatively simple processor, and merely upgrade the data converter. However, the mere change of a design to process in the frequency domain as opposed to the time domain will necessitate additional processing capability and programming.

SUMMARY OF THE INVENTION

The present invention disclosed and claimed herein comprises a data conversion circuit for receiving a signal in the time domain and providing an output in the frequency domain. A data converter is provided for converting data from an analog format to a digital format in the time domain. A processor is provided for processing the data in the digital format output from the data converter through a time domain/frequency domain transform to provide output data in the frequency domain.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
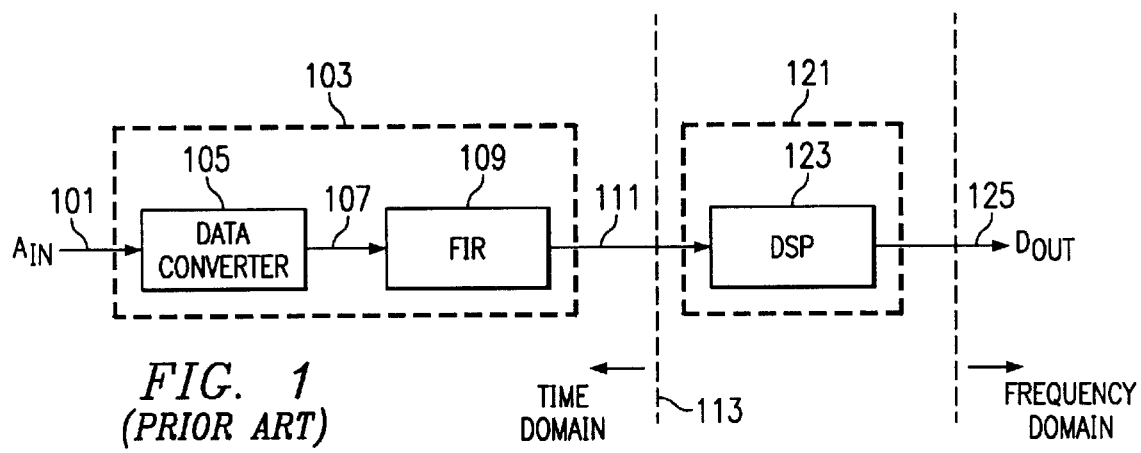
FIG. 1 illustrates a prior art representation of a two chip converter and a time domain/frequency domain conversion operation.

Referring now to FIG. 1, there is illustrated a block diagram of a prior art solution for receiving an analog signal, converting it to a digital domain signal, all in the time domain, and then converting it to the frequency domain to obtain frequency information therefrom. The analog signal $A_{IN}$ was received on an input 101 which is input to a first integrated circuit (IC) 103. The IC 103 is a basic analog-to-digital (A/D) converter. This is typically comprised of a data converter 105 which is operable to receive the analog input signal on the line 101, sample this signal at a predetermined sampling rate and convert each of the samples to a digital output value at the sampling rate. This data converter 105 can by any type of data converter such as a delta sigma converter, a successive approximation register (SAR) converter, or similar converter. This provides output digital values on a line 107 in the digital domain. This can then be processed by subsequent digital circuitry in a block 109, which block 109 illustrates a filter operation in the form of a Finite Impulse Response (FIR) filter, by way of example only. This provides an overall output from the IC 103 on a line 111 that is a stream of digital values.

Typically, the data converter 105 provides a multi-bit output with a defined data width. This is then input to the filter 109 which will typically operate at a higher data width. For example, the output of the data converter 105 may be a 12-bit output whereas the filter 109 processes in a 16-bit, or 32-bit data width. This will preserve the dynamic range of the initial A/D conversion. The filter 109 may then truncate the digital output values and then this output provided on a serial output by processing it through a parallel/serial converter (not shown). This, again, represents processing in the time domain, illustrated to the left of a phantom line 113.

The output of the IC 103 is input to an IC 121, which is basically comprised of a DSP engine 123. This DSP engine is operable to perform a predetermined transform on the data to convert the digital data output by the IC 103 into frequency domain information on a digital output 125. Typically, although not limiting, this utilizes a DFT transform. This type of transform will require a finite number of samples within a block to glean the frequency information, with each block having a set size and starting point.

Figure 2:
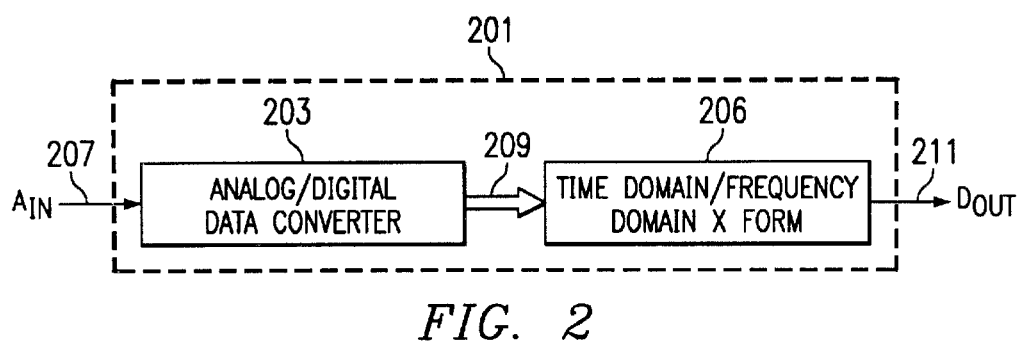
FIG. 2 illustrates an overall diagrammatic view of a monolithic solution in accordance with the present disclosure.

Referring now to FIG. 2 there is illustrated a block diagram of the integrated circuit of the present disclosure. However, it should be understood that, although this is referred to as an integrated circuit, it can be any monolithic solution wherein the combination of a data converter for converting information from one format to another format in a time domain is then processed through a transform to the frequency domain. In the present disclosure the overall conversion/conversion process is contained within an integrated circuit 201. The integrated circuit 201, as noted herein, is a monolithic solution that allows a data converter circuit 203 and a time domain/frequency transform block 206 in the form of a transform engine to be disposed on a single monolithic chip. The data converter 203, in the disclosed embodiment, is an analog/digital data converter. The data converter 203 receives an analog input from analog signal AN on a line 207, samples the signal and converts this to digital values in the time domain for output on a bus 209. This is then input to the transform block 206 for conversion to the frequency domain and the frequency content information in the form of digital values. These digital values are output on an output 211, referred to as the output $D_{OUT}$. This, in the disclosed embodiment, is a serial output such that some type of parallel/serial conversion is required.

In general, by incorporating both the data conversion operation and the frequency domain transformation circuit in the same monolithic circuit, a single measurement module is provided wherein the functions of a data converter and a processing circuit are incorporated into a single monolithic solution, which processing circuit can incorporate the functions that are normally associated with DFT-type calculations. As will be described hereinbelow, this is facilitated without requiring the full capability of a DSP.

Figure 3:
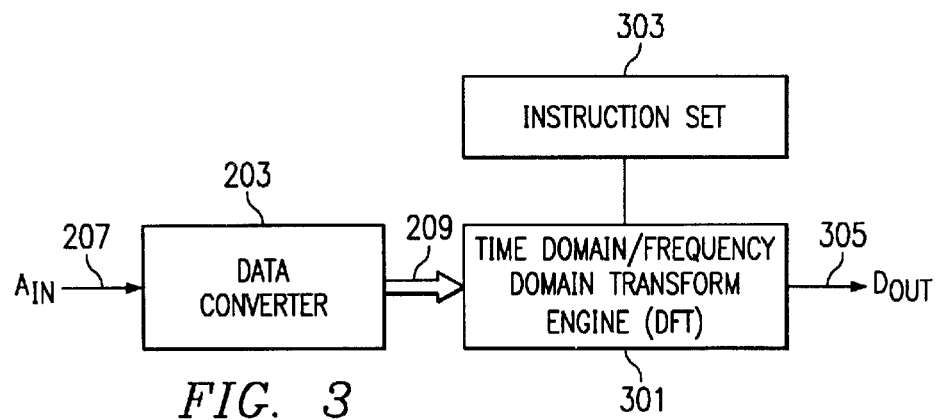
FIG. 3 illustrates a block diagram of the data converter and the TD/FD transform engine.

Referring now to FIG. 3, there is illustrated a block diagram of the basic operation of integrated circuit 202. The data converter 203 receives the input signal on line 207 and then converts it to sampled digital output values on the bus 209. This data converter can be realized with a delta-sigma converter, a SAR converter or similar type converter which will provide on the output thereof a sequence of digital words. These digital words are then received by a TD/FD transform engine 301 which is operable to perform DFT calculations. This DFT calculation is typically performed on a block of N input samples at a user specified or hardware specified block start time. Typically, transform engine 301 will require some type of instruction set in a block 303, which instruction set provides the information required by the transform engine 301 to perform the various calculations. Typically, this instruction set is separate from the engine 301, but it can be integrated into the transform 301 in the form of a hardware operation. The transform engine 301 typically operates at a different speed than the data converter 203, since the data converter 203 typically operates under the control of a sample clock at a sampling frequency $f_s$. The data converter 203 provides data at the sampling rate of the sample clock to the transform engine 301 for processing thereof at the processing speed of the transform engine 301. The transform engine 301 will typically provide an output therefrom a finite time after receiving the sampled data from the output of the converter 203. This can therefore result in some delay between the sampled data received from the converter 203 on bus 209 and the frequency domain data output from the transform engine 301 on a data output line 305. It is noted that the transform engine 301 need not be synchronized with the sample clock; rather, the only requirement is that a block of N samples be processed.

Figure 4:
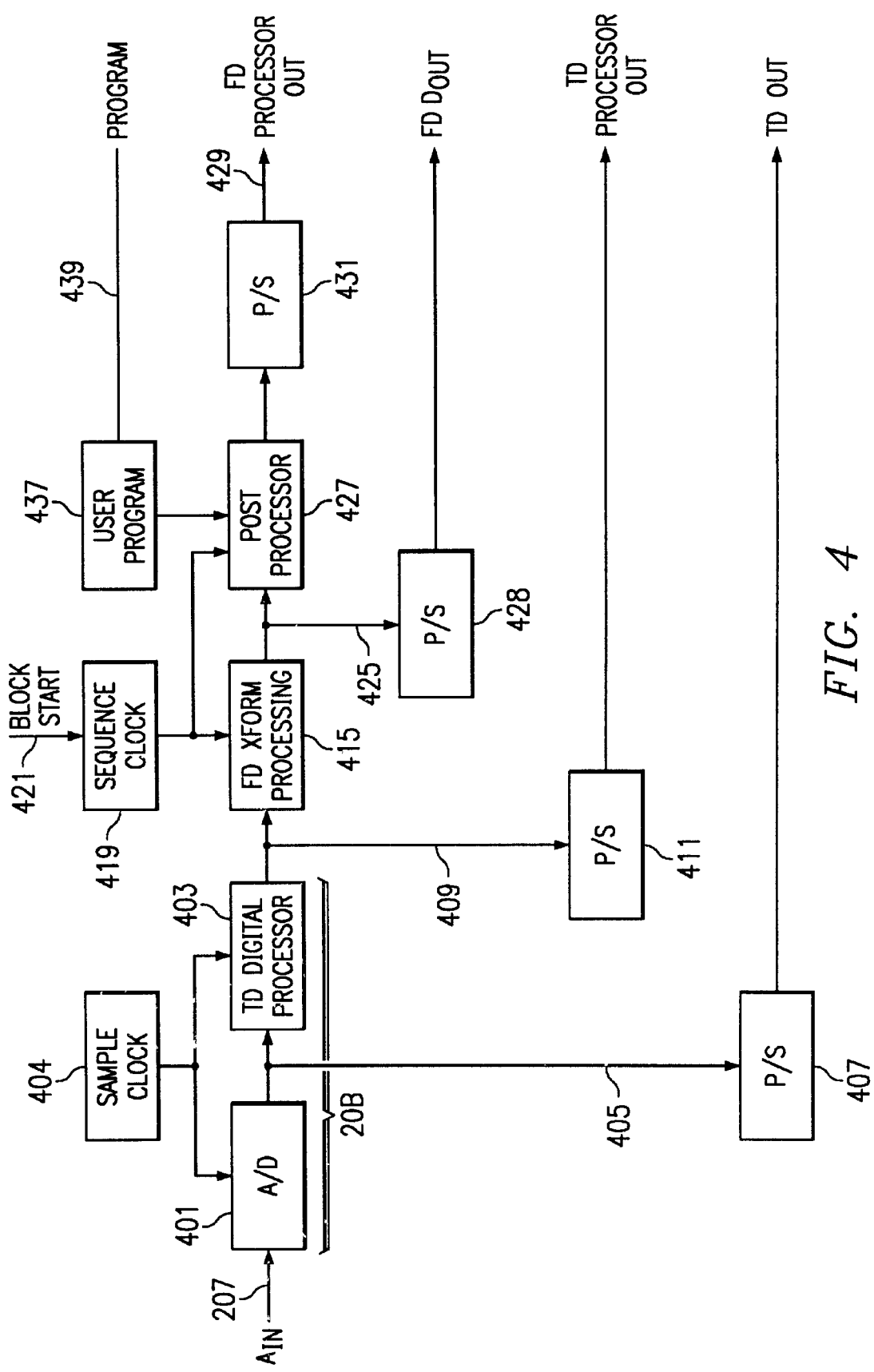
FIG. 4 illustrates a more detailed block diagram of the integrated circuit of the present disclosure.

Referring now to FIG. 4, there is illustrated a more detailed block diagram of the integrated circuit of the present disclosure. The analog input signal received on the analog input 207 is input to the data converter represented by data conversion section 203. This data conversion block 203 is represented by an analog/digital converter 401 which is operable to provide the basic conversion of an analog signal to a digital signal. Once converted to sampled digital signals, this sampled digital signal can then be processed in the time domain. This processing is represented by a block 403 which can be any type of digital processing. This digital processing, for example, could be filtering in the form of a filter, as described hereinabove with respect to FIG. 1. Alternatively, it could be any type of digital processing that is required to be performed in the time domain as a precursor to the frequency domain transform process. For example, windowing techniques can be utilized to avoid spectral leakage problems. This is defined in Frederic J. Harris, "On the Use of Windows for Harmonic Analysis with the Discrete Fourier Transform," Proc. IEEE, Vol. 66, No. 1, January 1978, pp 51–83. The A/D converter and the time domain digital processing section 403 are referred to a sample clock 404. This sample clock generates the clock signal $f_s$ which is utilized for the sampling operation, wherein the input analog signal $A_{IN}$ is sampled and converted to a digital signal, there being one digital output for each sample. The processing of the digital processing section 403 then operates on each of these samples.

The output of the A/D converter 201 can be output on a bus 405 to a parallel/serial converter 407 to provide a time domain output from A/D converter 201. The output of the processing section of the time domain digital processing section 403 is provided on the output of a bus 409 to a parallel/serial converter 411 to provide a processed time domain output. Again, this processing can be either mere filtering, some type of pre-processing in the time domain for the frequency domain transform process or a combination thereof.

Once the time domain information has been processed, it is output on the bus 409 to the input of a frequency domain transform process engine 415, which is substantially the same as engine 301. The frequency domain transform process engine 415 receives each of the digital sampled outputs in the time domain on bus 409 from the converter section 203. A sequence clock 419 is provided for controlling the operation of the frequency domain transform operation. With some transform algorithms, the data input thereto may have to be stored in some type of elastic storage device. The sequence clock 419 basically determines in what sequence the various multiplications and accumulations are to be carried out for the DFT algorithm or even the DFT operation. The DFT operation, as described hereinabove, operates on a block of samples. For example, the resolution of the DFT is the ratio of sampling frequency $f_s$ to the number of samples N. If the sampling frequency were 100 kHz and the number of samples N were equal to 1024, then the frequency resolution would be approximately 100 Hz. For this resolution, it would be required that 1024 samples be processed in a given block to provide the frequency information regarding those 1024 samples. This would provide frequency information for each 100 Hz increment or "frequency bin." The sequence clock requires some type of block start signal in the form of an input on an input line 421 which defines the start of the block, and the sequence clock 419 having knowledge as to the number of samples in the block. This is different than the requirement for the converter section 203, in that converter section 203 does not require any information as to the number of samples in the block.

Typically, the DFT algorithm will operate on a block of samples which will then provide frequency information in various "bins." These frequency bins are generated such that one is generated for each input sample output from the data converter 203, this being described in more detail hereinbelow. However, as also described hereinbelow, it is not necessary to output all of the information stored in the frequency bins which is generally calculated by the DFT algorithm. This will be the result of some post processing operation.

The output of the transform processor engine 415, which is comprised of the frequency information in the various bins, is output on a bus 425 and can be input to a parallel/serial converter 428 for direct output thereof as a serial digital value. This therefore provides serial output information as to the various binned information. Typically, this can be an addressable location, as will be described hereinbelow. The bus 425 is also input to a post processor 427, which post processor 427 can perform certain operations on the binned information output by the transform processor 415. This will provide frequency domain process output information on an output 429 through a parallel/serial converter 431.

The post processor 427 allows a user to basically perform certain operations on the binned frequency information. For example, it may be that all the information required by the user is merely magnitude information from a few bins. In situations where the input/output (I/O) bandwidth is a concern, calculating, post processing, and outputting only a subset of the total number of frequency bins may be desirable. This can be programmable through the user program block 437 which receives an external program signal on a line 439 or the programming can be provided at a mask level. As such, binned information can be processed to provide less than all the binned information output therefrom. This is advantageous in that it may not be necessary to perform all the calculations necessary for complete analysis of the frequency content. For example, it may be that all the information that is required by the user is merely magnitude information from a few bins.

Although the time domain processor 403, the transform block 415 and the post processor 427 have been disclosed as utilizing separate processing engines, two or all of these functions could be performed by a single processing engine.

Figure 5:
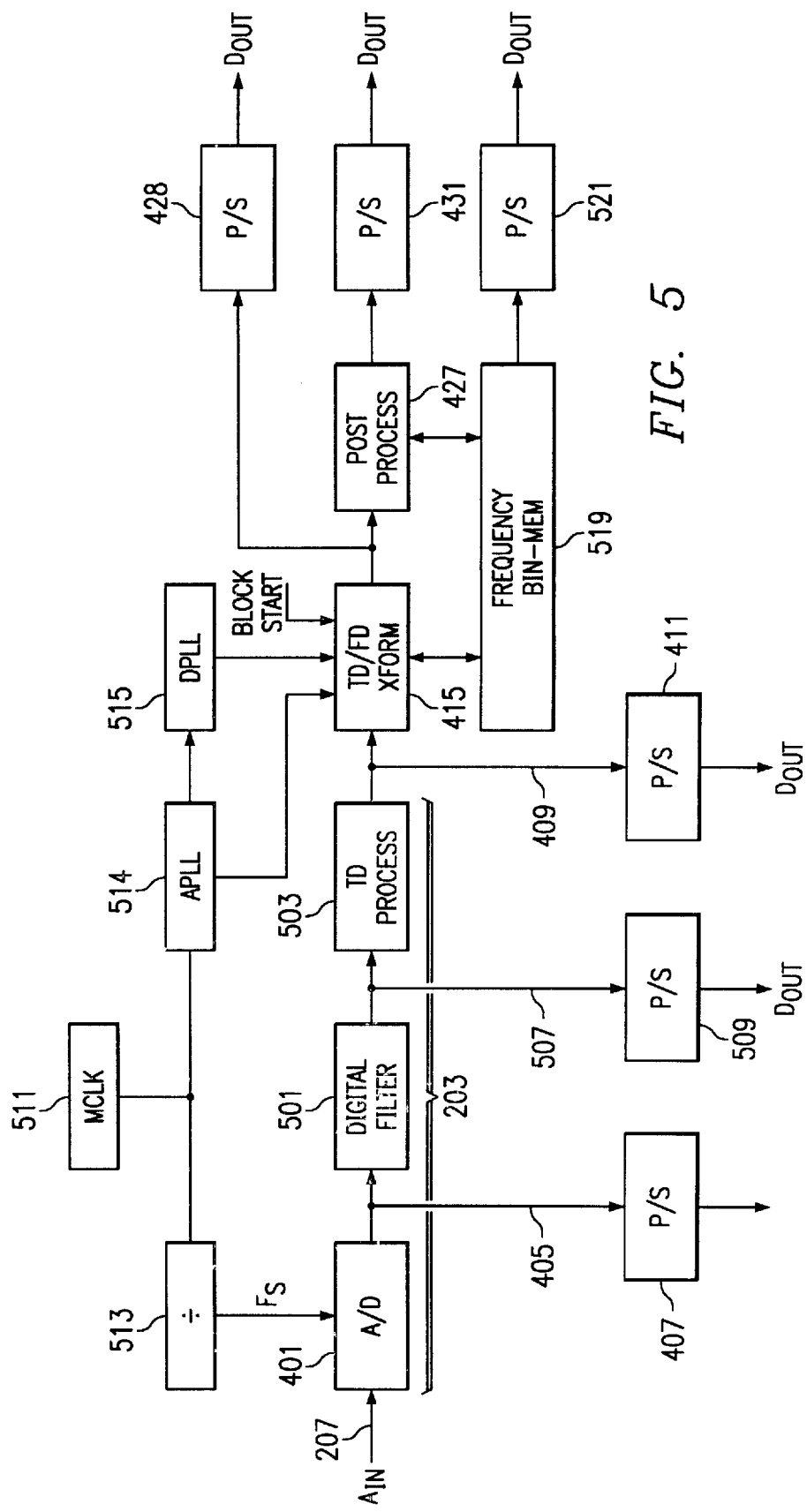
FIG. 5 illustrates a detailed block diagram of the present disclosure illustrating the various input/outputs at the post processing operation.

Referring now to FIG. 5, there is illustrated an even more detailed block diagram of the integrated circuit of the present disclosure. In this embodiment, the digital processing section 203 is comprised of A/D converter 401, which has the output thereof input to a digital filter section 501, the output of the digital filter section input to a time domain processing section 503. The digital filter section 503 is basically associated with the A/D converter section 401 in that it provides filtering in the time domain. The time domain processing section 503 is primarily a pre-processing section for pre-processing the digital data input to the frequency domain transform block 415. The output of the digital filtering section 501 can be provided as a separate output from a bus 507 to a parallel/serial converter 509 to provide a digital output of the partially processed time domain information in the digital domain.

The timing information is generally provided by a master clock 511 which is operable to generate a master clock signal. This can be divided by divide circuit 513 to provide a sampling frequency $f_s$. However, the sequencing operation provided by the transform block 415 is not necessarily synchronized with the sampling clock. As such, an analog phase lock loop (APLL) 514 is provided to give a multiply operation and scale the master clock up in frequency, followed by a digital phase lock loop (DPLL) 515 which is provided for functions such as digital noise management. Again, there is a block start operation that must be provided for the transform block 415.

The frequency domain output of the transform operation can be stored in frequency bins 519 which are addressable locations in the integrated circuit. These can be directly output through a parallel/serial converter 521, which basically allows for addressable selection thereof, the addressing operation not illustrated. The output of the transform block 415 is input to the post processor section 427 to allow direct post processing thereof, with the results thereof storable in the memory 519. Alternately, each of the binned values stored in memory by the transform block can be input to the post processing section 427 for processing thereof, the output thereof input to a parallel/serial converter 431. This post processing section 427, since all of the frequency information is collected and stored in the bins, can process any amount of this information to provide an output in accordance with a pre-determined post processing algorithm. It is noted that this post processing algorithm need not require all the frequency bin information to be stored. As such, this will reduce the amount of storage required, and also possibly reduce the amount of processing required by the transform block 415.

Since the entire string of processing for the time domain and the frequency domain is contained on a single integrated circuit chip, this removes the requirement for an I/O interface between two chips. As such, it can be seen that the various bus widths can be increased internal to the chip and then decreased or truncated for output therefrom. For example, the A/D converter could be realized with a SAR to provide a 12-bit output. The digital filter section 501, in order to maintain the resolution of A/D converter 401, could be operated at 16-bits to provide on the output there of a 16-bit output on bus 507. This 16-bit output could then be processed through a time domain process block 503 which could process at the 16-bit data width or even wider. This same 16-bit output or wider data width could be output on the bus 409 to the transform block 415 without requiring any truncation or subsequent processing to account for I/O considerations. This direct output can be input to the transform block 415, which in and of itself could require wider data paths for the processing. This data path can be output directly into the frequency bins or be truncated before input to the frequency bin. This, in general, will allow the system to maintain the wider internal bus width and maintain the data resolution of the A/D converter 401.

Figure 5A:
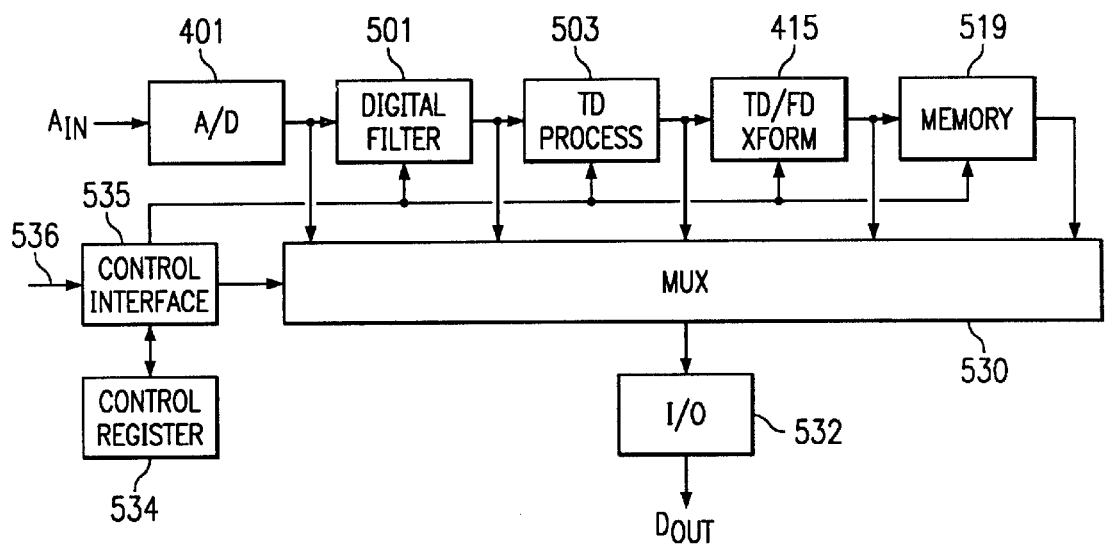
FIG. 5a illustrates an alternate embodiment with a multiplexer.

Referring now to FIG. 5a, there is illustrated an alternate embodiment of FIG. 5 wherein a multiplexer 530 is provided. The multiplexer 530 is operable to receive the output of each of the process blocks, the A/D converter 401, the digital filter 501, the timing domain processor 503, the TD/FD transform block 415 and the memory 519. These outputs are input to the multiplexer 530, one of which is selected for processing through an output interface block 532 to provide a single pin output. Therefore, with a chip having a single analog input and a single digital output, various processing functions can be provided with the output representing values in the time or frequency domains. This can be, of course, for the purpose of selective processing, or it could be for the purpose of diagnostics. This diagnostic mode would allow the user to determine process information at each stage of the process.

In order to control the overall operation of the frequency domain integrated circuit described hereinabove, a control interface 535 is provided. The control interface 535 is interfaced with a multiplexer 530 and all of remaining blocks in the system, the digital filter 501, the time domain processor 503 and the TD/FD transform block 415, in addition to the memory 519. In general, the control interface 535 allows the user a single port or pin by which to control various aspects of the system. A control register 534 is provided which is interfaced with the control interface 535 for storing control parameters that are associated with the operation of the integrated circuit. This allows a user to both provide commands through the line 536 to control the operation thereof and also allows data to be downloaded to the control register 534 or extracted from the control register 534. This control interface 535 therefore provides a "common control interface" for the overall chip in the form of the data converter portion for providing digital data in the time domain and the frequency domain translator portion. This is to be compared to previous systems that require multiple chips and separate control interfaces therefore. As such, less control pins will be required for a totally integrated solution by utilizing a common control interface. Only one interface is required in addition to the user only requiring to have knowledge as how to interface with this single interface.

Figure 5B:
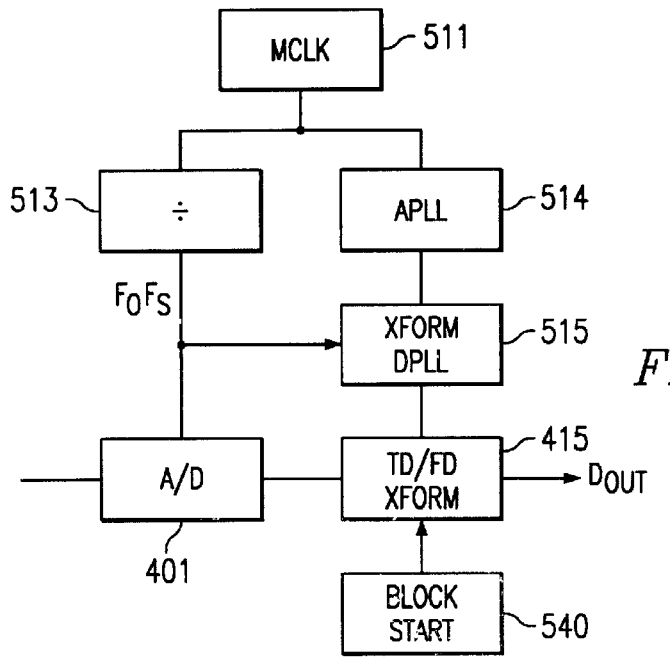
FIG. 5b illustrates a detail of the timing operation.

Referring now to FIG. 5b, there is illustrated a more detailed block diagram of a clocking operation. In general, the master clock 511 provides an output at a defined frequency period. Typically, this is a crystal controlled output. Since it is crystal controlled, designers would prefer to use a relatively inexpensive and easily obtainable crystal. This results in a relatively low frequency crystal. Since the digital processing operation is performed at a substantially higher clock rate than that associated with conventionally available crystals, the master clock frequency at block 511 will be multiplied with the use of an analog phase lock loop (APLL) 514. To allow for some digital domain "quiet time" immediately prior to analog sampling, the DPLL 515 will be utilized to provide a digital transform clock to the transform block 415. In addition to the transform clock, as described hereinabove, there is required a block start operation, as indicated by a block 540. This will be described hereinbelow.

Figure 6:
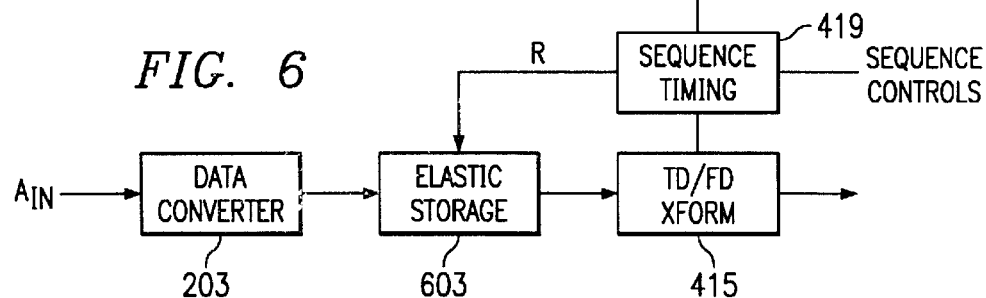
FIG. 6 illustrates a simple block diagram showing the elastic storage interface between the A/D converter and TD/FD transform block.

Referring now to FIG. 6, there is illustrated a block diagram of an example interface between the data conversion section 203 and the transform block 415. This is in the form of an elastic storage device 603. This elastic storage device 603 requires the data to be sampled at the sample rate of the sample clock $f_s$ in data conversion section 203. The actual calculation or sequencing of the transform block 415 is not necessarily synchronized with the sample clock. However, it is noted that the number of output values is less than or equal to the number of samples input for a given block size. If the block size, for example, were 1024, then there would be 1024 outputs provided, this being the resolution of the DFT algorithm. However, the data is not necessarily required by the transform block 415 at uniform intervals, and therefore, the elastic storage block 603 will be required. This elastic storage block 603 will be controlled by the sequence clock 419 which will generate a Read signal for the storage block 603 for input into the transform block 415. It is noted that the elastic store of FIG. 6 can be located anywhere within the process chain. It could be part of transform block 415 or part of any of the previous time domain processing sections in the chain. Further, some elastic storage can be provided on the output of the transform block 415.

Figure 7:
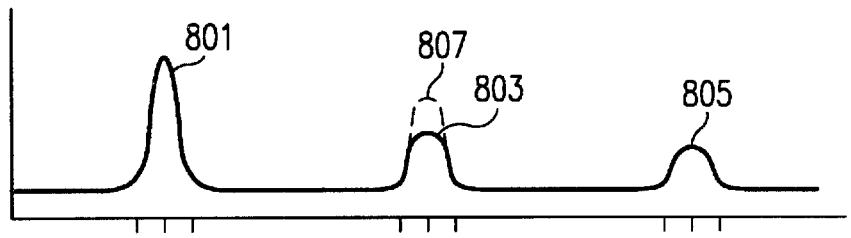
FIG. 7 illustrates an application of the TD/FD transform operation.

Referring now to FIG. 7, there is illustrated a plot of the frequency output for a given application, such as measurements of a rotating system. The rotating system has a fundamental operating frequency 801 which would represent the resolutions per minute (RPM). This would also have harmonics, a second harmonic 803 and third harmonic 805 and subsequent harmonics thereafter (not shown). It may be that a distortion would be desirable to measure (as an example of bearing wear, for example) or even a variation in the fundamental frequency. From a distortion standpoint, all that will be required would be to look at the relative amplitude of one of the harmonics. In the frequency domain, this is a relatively easy thing to do in that the second harmonic 803 can be measured over time and then the magnitude thereof compared with the previous magnitude. If there is a change in the magnitude, this would indicate some type of distortion. This would be virtually impossible to detect in the time domain, as very small changes are difficult to measure from a distortion standpoint, whereas the frequency domain facilitates such a measurement. This would be illustrated as a change in the output of the second harmonic, illustrated by phantom line 807.

Figure 8:
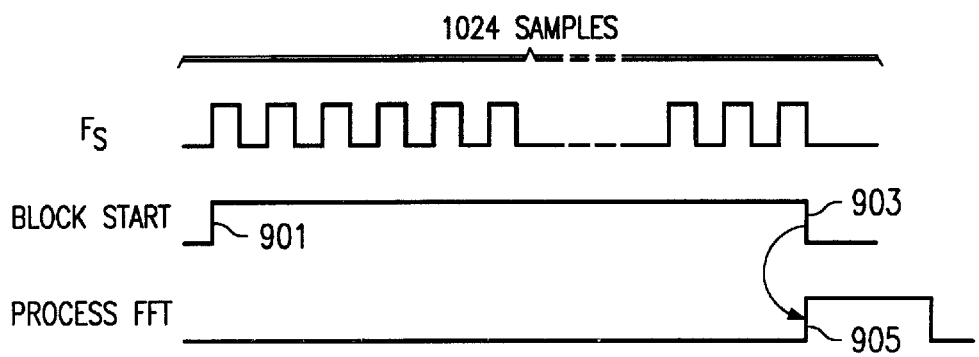
FIG. 8 illustrates a diagrammatic view of the block start signal and the sampling frequency.

Referring now to FIG. 8, there is illustrated a timing diagram illustrating the sampling frequency and the block operation. As described hereinabove, the transform operation requires N samples over which the transform is performed, i.e., there is a block of samples required to perform the transform. There is illustrated the sampling clock $f_s$ which basically provides for a predetermined number of N samples—in this example 1024 samples. A block start is initiated at an edge 901 and proceeds to an edge 902 which basically collects the samples. Different frequency domain transforms facilitate situations wherein certain of the calculations required thereby can be performed concurrently with the sample gathering for a given block of samples, i.e., prior to the time that all the samples are gathered for the given block. Thus, different transform algorithms may yield different amounts of pipelined delay before the frequency domain results are available.

The transforms described hereinabove were the DFT and the FFT transforms. However, there were many other transforms that can be utilized in transforming a time domain value to a frequency domain value. These transforms can result in significantly less calculations. For example, the Goertzel transform is a transform that allows the transform to be carried out for a single bin with a relatively simplistic algorithm. This requires a very small number of clock cycles in order to perform this operation. This algorithm is described in Goertzel, "An Algorithm for the Evaluation of Finite Trigonometric Series," American Math Monthly, 65, pp. 34–35, January 1958, which reference is incorporated herein by reference. Therefore, if only the information for a single bin were required, the Goertzel algorithm would be sufficient and this algorithm could easily be facilitated in a hardware application. Further, since the Goertzel algorithm is relatively straight forward, it would be relatively easy to change to a different bin number.

Figure 9:
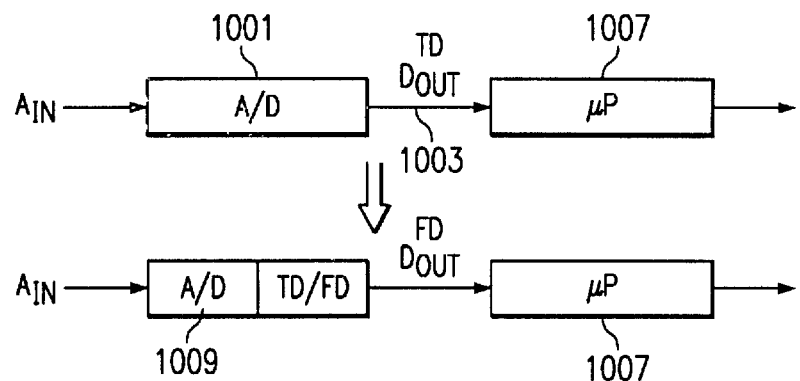
FIG. 9 illustrates a diagrammatic view of an upgrade operation.

Referring now to FIG. 9, there is illustrated an overall system operation wherein a prior art system is upgraded to the current apparatus. In the prior system, a time domain data converter 1001 is provided for converting an analog input value to a time domain digital output value on a line 1003. This is received by a microprocessor 1007. In a situation where a designer wanted to process information in the frequency domain or make decisions in the frequency domain, this would then require the microprocessor to receive the time domain digital output and apply additional processing thereto. Typically, in an application wherein the time domain digital output were processed, this would require significantly more processing power, the significantly more processing power (and/or programming) required to perform some type of transform from the time domain to the digital domain. By upgrading the system to a data converter 1009 having the ability to provide the data conversion in the time domain and then convert the information to the frequency domain, the frequency domain output can then be utilized for processing with the same microprocessor 1007. The instructions required therefor would be minimal to upgrade the operation. Therefore, by utilizing the device of the present disclosure, frequency domain processing can be provided without requiring any upgrade in the processing section. This will be desirable from a designer standpoint in that the complexity of programming the microprocessor 1007 would, in and of itself, facilitate a much nicer design.

Figure 10:
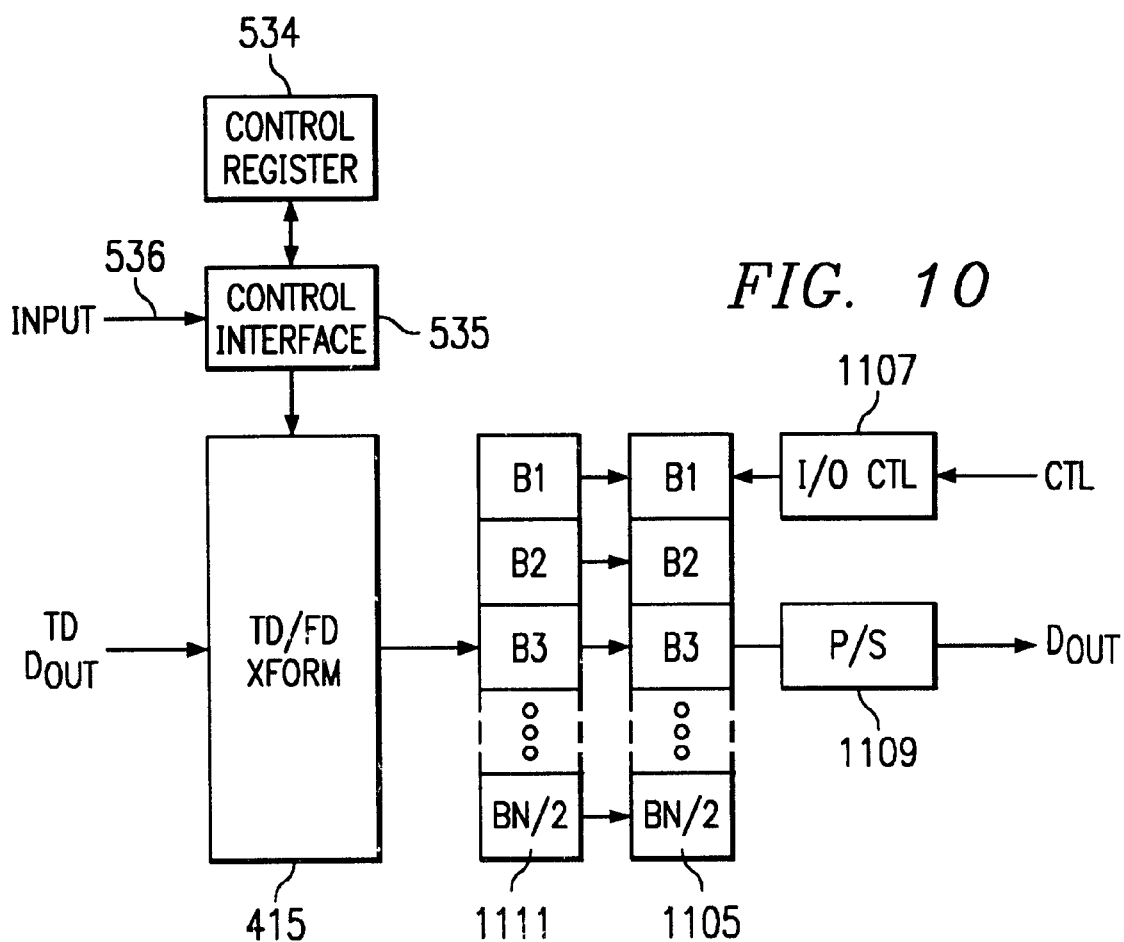
FIG. 10 illustrates a block diagram of the user programmable operation of the time domain/frequency domain transform block 415.

Referring now to FIG. 10, there is illustrated a block diagram of the configure operation wherein the user can program the operation of the transform block 415. In general, the transform block 415 will be a processing unit that will perform calculations in accordance with the predetermined frequency domain transform algorithm. However, there are some parameters that can be applied to the transform to alter the operation thereof. For example, in the Goertzel transform, there can be some type of address shift such that the particular bin that is calculated is definable by the user. This is facilitated through the use of the configuration interface 535 which can receive input information on line 536. This allows the user to externally input certain configuration information. This provides a more versatile system.

The output of the transform block 415 can then be input to one of multiple bins 1105. It may be that the integrated circuit is designed to only perform calculations for association with certain bins or provide all N/2 bins, each bin storing a real and imaginary part. If multiple bins are provided, there is some type of addressing that is required which is provided by an input/output control block 1107. This receives a control signal external to the system to select a bin for output therefrom. Further, there could be a situation wherein the bins are sequentially output and the control block 1107 would control such output. These are then processed through a parallel/serial block 1109 and then provide a serial output. This type of output is conventional. Typically, whenever dealing with this type of storage, there would typically be provided two memory storage locations, one for the output bins 1105 and an additional block 1111 for the accumulation operation. In general, each of the bins must be subject to an accumulation operation during the processing and then the final output latched over into the bin memories 1105.

Although the preferred embodiment has been described in detail, it should be understood that various changes, substitutions and alterations can be made therein without departing from the spirit and scope of the invention as defined by the appended claims.

What is claimed is:

1. A data conversion integrated circuit for receiving a signal in the time domain and providing an output in the frequency domain, comprising:

a data converter formed on an integrated circuit substrate for converting data from an analog format in the time domain to a digital format in the time domain to provide an output at a predetermined data width with a corresponding number of data lines;

a transform processor formed on said integrated circuit substrate for processing the data in the digital format output through a time domain/frequency domain transform to provide data in a digital format in the frequency domain to provide an output at a predetermined data width with a corresponding number of data lines;

an interface formed on said integrated circuit substrate for interfacing the output of said data converter with its associated predetermined data width to the input of said transform processor; and an output interface from the integrated circuit for providing an output of at least the output of said transform processor, said output interface having less data lines than the output of said transform processor, wherein the output of said data converter and the output of said transform processor are input to a multiplexer, said multiplexer controlled by a control signal to select either the output of said data converter or the output of said transform processor to provide a single output from the data conversion circuit to said output interface.

2. The data conversion circuit of claim 1, and further comprising a timing circuit for controlling the timing operation of said data converter and said transform processor such that the operation of said data converter and said transform processor are associated with a common time base.

3. The data conversion circuit of claim 1, wherein said data converter is operable to output a plurality of sampled values at a sampling rate at of $f_s$ and wherein said time domain/frequency domain transform operates on a predetermined number of samples as a block of samples, wherein said calculations performed by said time domain/frequency domain transform require all of said samples in said block.

4. The data conversion circuit of claim 3, wherein said time domain/frequency domain transform comprises a discrete fourier transform DFT transform).

5. The data conversion circuit of claim 4, wherein said transform processor is operable to perform a partial transform after the receipt of each sample in said block.

6. The data conversion circuit of claim 5, wherein there are N samples in each of said blocks and said DFT transform calculates N/2 real parts and N/2 imaginary values.

7. The data conversion circuit of claim 3, wherein the output of said transform processor comprises a plurality of real and imaginary values, each associated with a frequency bin, there being in N/2 bins for N samples.

8. The data conversion circuit of claim 3, wherein said time domain/frequency domain transform comprises a fast fourier transform.

9. The data conversion circuit of claim 3, wherein said time domain/frequency domain transform comprises a Goertzel transform.

10. The data conversion circuit of claim 1, and further comprising a controller varying the operation of the time domain/frequency domain transform through variation of associated parameters in response to external program signals, such that the operation of said time domain/frequency domain transform can be altered.

11. The data conversion circuit of claim 1, and further comprising a digital time domain processor for processing the output of said data converter in the digital time domain prior to input to said transform processor through said interface.

12. The data conversion circuit of claim 11, wherein said digital time domain processor and said time domain/frequency domain transform are realized with a single processing engine.

13. The data conversion circuit of claim 1, and further comprising a post-processor for receiving the output of said transform processor and performing predetermined operations thereon prior to output therefrom.

14. The data conversion circuit of claim 13, and further comprising a memory for storing the output of said past-processor.

15. The data conversion circuit of claim 1, and further comprising a memory for storing the output of said transform processor.

16. The data conversion circuit of claim 1, and further comprising a controller for varying both the time domain and frequency domain operation through variation of associated parameters in response to external program signals.

17. The data conversion circuit of claim 1, and further comprising a controller for varying both the time domain and frequency domain operation through variation of associated parameters in response to external program signals received through a common control interface.

18. A method for receiving a signal in the time domain and providing an output in the frequency domain, comprising the steps of:

converting data with a data converter formed on an integrated circuit substrate from an analog format in the time domain to a digital format in the time domain to provide an output at a predetermined data width with a corresponding number of data lines;

processing the data with a transform processor formed on the integrated circuit substrate in the digital format output through a time domain/frequency domain transform to provide data in a digital format in the frequency domain;

interfacing the output of the data converter with its associated predetermined data width to the input of the transform processor;

providing through an output interface an output of at least the output of the transform processor, the output interface having less data lines than the output of the transform processor; and inputting the output of the data converter and the output of the transform processor to a multiplexer, and controlling the multiplexer by a control signal to select either the output of the data converter or the output of the transform processor to provide a single output therefrom to the output interface.

19. The method of claim 18, and further comprising the step for controlling the timing operation of the data converter and the transform processor with a timing circuit such that the operation of the data converter and the transform processor are associated with a common time base.

20. The method of claim 18, wherein the data converter is operable to output a plurality of sampled values at a sampling rate at of $f_s$ and wherein said time domain/frequency domain transform operates on a predetermined number of samples as a block of samples, wherein the calculations performed by the time domain/frequency domain transform require all of the samples in the block.

21. The method of claim 20, wherein the time domain/frequency domain transform comprises a discrete fourier transform (DFT transform).

22. The method of claim 21, wherein the transform processor is operable to perform a partial transform after the receipt of each sample in the block.

23. The method of claim 22, wherein there are N samples in each of the blocks and the DFT transform calculates N/2 real parts and N/2 imaginary values.

24. The method of claim 20, wherein the output of the transform processor comprises a plurality of real and imaginary values, each associated with a frequency bin, there being in N/2 bins for N samples.

25. The method of claim 20, wherein the time domain/frequency domain transform comprises a fast fourier transform.

26. The method of claim 20, wherein the time domain/frequency domain transform comprises a Goertzel transform.

27. The method of claim 18, and further comprising the step of varying the operation of the time domain/frequency domain transform through variation of associated parameters in response to external program signals, such that the operation of said time domain/frequency domain transform can be altered.

28. The method of claim 18, and further comprising the step of processing the output of the data converter with a digital time domain processor in the digital time domain prior to input to the transform processor.

29. The method of claim 28, wherein the step of processing with the digital time domain processor and the step of processing with the transform processor are realized with processing with a single processing engine.

30. The method of claim 18, and further comprising the step of receiving with a post-processor the output of the transform processor and performing predetermined operations thereon prior to provide an output therefrom.

31. The method of claim 30, and further comprising the step of storing the output of said post-processor in a memory.

32. The method of claim 18, and further comprising the step of storing the output of the transform processor in a memory.

33. The method of claim 18, and fir comprising tie step of varying both the time domain and frequency domain operation through variation of associated parameters in response to external program signals.

34. The method of claim 18, and further comprising the step of varying both the time domain and frequency domain operation through variation of associated parameters in response to external program signals received through a common control interface.

35. The data conversion circuit of claim 18, wherein said multiplexer is operable to receive as inputs the data at the data width associated with the output of said data converter and the output of said transform processor and provide through said output interface a single bit single serial output, said output interface further including a parallel-to-serial converter for converting the predetermined data widths of said transform processor and said data converter to a single bit serial data stream.

36. The method of claim 18, wherein the output interface has a data width of one and further comprising the step of converting the data width associated with thee output of the transform processor with a parallel-to-serial converter to a single bit serial data stream.

37. The method of claim 18, wherein the multiplexer is operable to receive as inputs the data at the data width associated with the output of the data converter and the output of the transform processor and provide through the output interface a single bit single serial output, the output interface further including the step of converting the predetermined data widths of the transform processor and the data converter to a single bit serial data stream with a parallel-to-serial converter.

* * * * *